United States Patent
Bocchino et al.

(10) Patent No.: US 6,651,155 B1
(45) Date of Patent: Nov. 18, 2003

(54) APPARATUS AND METHOD FOR TRANSLATING A PROGRAMMABLE LOGIC DEVICE PROGRAMMER OBJECT FILE

(75) Inventors: Vincent T. Bocchino, San Mateo, CA (US); Colin Hendry, Maidenhead Berks (GB); Stephane Cauneau, London (GB); Virendra Patel, Wembley (GB)

(73) Assignee: Altera Corporation, San Jose, CA (US)

(*) Notice: Subject to any disclaimer, the term of this patent is extended or adjusted under 35 U.S.C. 154(b) by 164 days.

(21) Appl. No.: 09/918,907

(22) Filed: Jul. 30, 2001

Related U.S. Application Data
(60) Provisional application No. 60/225,027, filed on Jul. 28, 2000.

(51) Int. Cl.[7] .............................................. G06F 12/00
(52) U.S. Cl. ...................................... 711/202; 711/103
(58) Field of Search .................................. 711/103, 202

(56) References Cited

U.S. PATENT DOCUMENTS

| | | | | |
|---|---|---|---|---|
| 5,590,305 A | * | 12/1996 | Terrill et al. ................. | 711/103 |
| 6,052,755 A | * | 4/2000 | Terrill et al. ................. | 711/103 |
| 6,314,550 B1 | * | 11/2001 | Wang et al. ................... | 716/17 |
| 6,414,871 B1 | * | 7/2002 | Wirtz et al. ............. | 365/185.01 |

* cited by examiner

Primary Examiner—Kevin Verbrugge
(74) Attorney, Agent, or Firm—Pennie & Edmonds LLP

(57) ABSTRACT

A circuit for translating a configuration file used to configure a programmable logic device includes a first register to serially receive configuration data. A second register receives, in parallel, configuration data from the first register. A translation address memory translates an original address for a selected configuration bit of the configuration data to a translated address. A translation memory stores the selected configuration bit at the translated address. Control logic selectively downloads configuration data from the translation memory to a programmable logic device core.

19 Claims, 5 Drawing Sheets

APPARATUS AND METHOD FOR TRANSLATING A PROGRAMMABLE LOGIC DEVICE PROGRAMMER OBJECT FILE

CROSS REFERENCE TO RELATED APPLICATIONS

The present application claims priority to U.S. provisional Application Ser. No. 60/225,027, filed Jul. 28, 2000.

BRIEF DESCRIPTION OF THE INVENTION

This invention relates generally to techniques for configuring programmable logic devices. More particularly, this invention relates to a technique for configuring a programmable logic device using a hardware circuit to translate a programmer object file.

BACKGROUND OF THE INVENTION

A programmable logic device or PLD (sometimes referred to as a PAL, PLA, FPLA, EPLD, EEPLD, LCA, or FPGA) allows a user to electrically program standard, off-the-shelf logic elements to meet a user's specific needs. PLDs are currently represented by, for example, Altera's MAX® series of PLDs and FLEX® series of PLDs.

A programmable logic device is configurable circuitry that is programmed by a process commonly referred to as device configuration. During configuration, user-defined data is converted to binary representations, or configuration bits, to implement either logic, interconnect or memory functions. A PLD has a number of relatively simple logic modules which can be interconnected in any of a wide variety of ways via a general purpose interconnection network to enable the circuit to perform logic functions which can be quite complex.

A typical PLD consists of an array of identical logic cells that can be individually programmed, and which can be arbitrarily interconnected to each other to provide internal input and output signals, thus permitting the performance of highly complex combinational and sequential logic functions. During configuration, a program is implemented in the PLD by setting the device routing and the states of programmable elements, such as configuration memory cells. The configuration memory cells are loaded with configuration data selected to cause the PLD to perform a desired function. For some PLDs, reprogramming is achieved by changing the configuration data contained in the memory cells.

A PLD architecture is commonly characterized by the logic structure of its family of programmable integrated circuits. Architecture design parameters typically include device density, speed, functionality, and other design, processing and performance considerations. As PLD architectures and chip designs continue to evolve based on improvements involving such considerations, the task of programming the circuit tends to become more complex.

As the number of elements increases, it becomes important to improve the techniques used to interconnect them. For example, it is important to provide enough interconnection pathways between the programmable logic elements so that the capabilities of those elements can be fully utilized and so that complex logic functions (requiring concatenation of programmable logic elements) can be performed, without providing so many pathways that there is wasteful excess of this type of resource. Similarly, as the number of programmable elements increases, the complexity of the logic which can be performed also increases. But improvements in density, speed and the other design considerations noted above tend to increase the complexity of the task of programming the circuit.

Configuration data is a bit stream of programming information made up of configuration bits. The configuration data is in a binary format stored as a configuration file, also frequently referred to as a Programmer Object File (POF). Upon start-up of a system, configuration data from a configuration memory is downloaded into a programmable logic device. Some PLD architectures use SRAM configuration elements that require configuration data to be loaded every time the circuit device powers up. Before configuration, some devices initiate a Power-On Reset (POR). This POR event clears the device and prepares it for configuration. While the POR time is very fast, some devices impose an additional delay that allows system power to stabilize before configuration. Once the configuration data is downloaded into the PLD, the PLD executes the logic functions specified by the POF.

During initialization, which generally occurs immediately after configuration, the PLD device resets registers, enables I/O pins, and begins to operate as a logic device. For devices where configuration and initialization occur, these processes together are often referred to as the command mode and normal device operation is the user mode.

In some configurations and devices, elements are configured in-circuit by loading new configuration data into the device. Real-time reconfiguration can be performed by forcing the device into command mode with a device pin, loading different configuration data, re-initializing the device, and resuming user-mode operation. In many cases the reconfiguration process requires less than 40–300 ms and can be used to reconfigure an entire system dynamically. In-field upgrades can be performed by distributing new configuration files by modem, over the internet, by diskette or other communication methods.

Currently, new configuration data is required every time the architecture of a programmable logic device is altered. It is relatively time consuming to produce new configuration data, particularly given the variety of device architectures and approaches used for configuration purposes. Accordingly, it would be highly desirable to be able to utilize existing configuration data with evolving programmable logic device architectures.

SUMMARY OF THE INVENTION

The invention includes a circuit for translating a configuration file used to configure a programmable logic device. The circuit includes a first register to serially receive configuration data. A second register receives, in parallel, configuration data from the first register. A translation address memory translates an original address for a selected configuration bit of the configuration data to a translated address. A translation memory stores the selected configuration bit at the translated address. Control logic selectively downloads configuration data from the translation memory to a programmable logic device core.

The invention also includes a method of translating a configuration file used to configure a programmable logic device. The method includes the step of shifting configuration data into a first register. The configuration data is loaded in parallel from the first register into a second register. Additional configuration data is shifted into the first register while performing the steps of obtaining a new address for a selected configuration bit in the second register, writing the selected configuration bit to the new address in a memory, and repeating the obtaining and writing steps until all configuration bits in the second register have been processed. The contents of the memory are then downloaded to a programmable logic device core so as to configure the programmable logic device.

BRIEF DESCRIPTION OF THE DRAWINGS

Reference should be made to the following detailed description taken in conjunction with the accompanying drawings, in which.

Like reference numerals refer to corresponding parts throughout the drawings.

DETAILED DESCRIPTION OF THE INVENTION

As noted in the background description, currently new configuration data is required every time the architecture of a programmable logic device is altered. The invention is directed to the use and application of a configuration file from a first PLD architecture to a new architecture. For purposes of this disclosure, new architecture shall refer to a different, revised, updated, modified or next generation PLD or PLD chipset architecture or class relative to a first PLD or PLD architecture requiring a different configuration file from the first architecture. For purposes of this disclosure, first architecture shall refer to a PLD architecture upon which the configuration file that is translated to the new architecture is derived.

Figure 1:
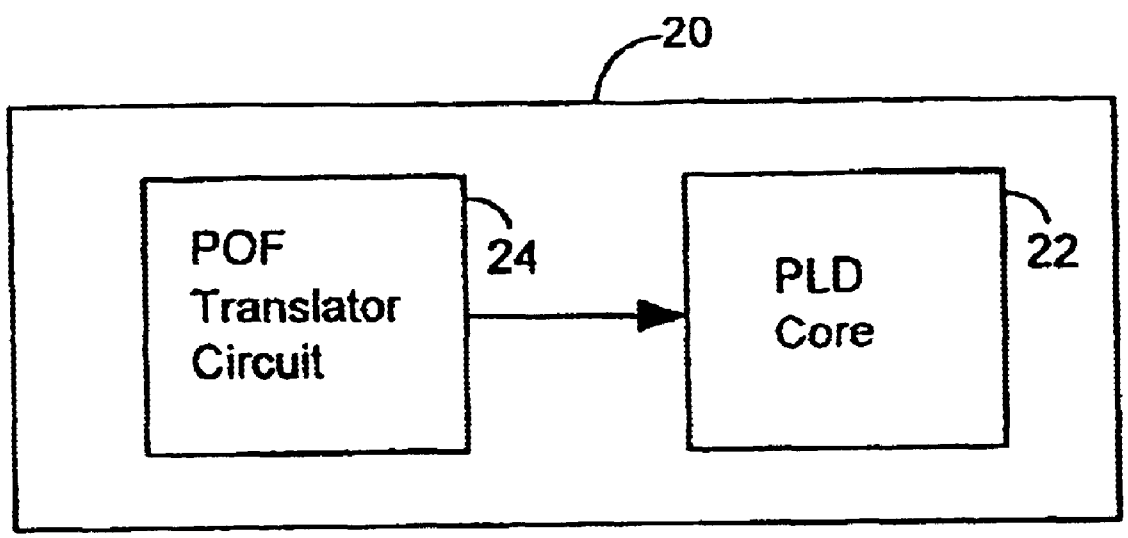
FIG. 1 illustrates a programmable logic device constructed in accordance with an embodiment of the invention.

FIG. 1 illustrates a programmable logic device (PLD) 20 constructed in accordance with an embodiment of the invention. The PLD 20 includes a Programmer Object File (POF) translator circuit 24. The circuit and technique of the invention allows a single configuration file to be used in connection with evolving programmable logic device architectures. Thus, the new architecture can use an old configuration file or configuration file associated with the first architecture or previous generation PLD, and otherwise operate in a manner that is familiar to a user (e.g., same pin out or performance).

Currently, configuration data for some devices can be loaded with one of several configuration schemes chosen on the basis of the target application. In some cases, multiple devices can be configured by connecting configuration enable and configuration enable output pins on each device. The POF translator circuit 24 is a hardware-based circuit used to translate a configuration file used in connection with a first PLD architecture into a configuration file that can be used in connection with a new architecture. The POF translator circuit 24 operates to translate addresses for configuration bits associated with a first generation PLD into new addresses for configuration bits associated with the new PLD architecture. The addresses can be preferably identified by bit frames corresponding to one or more address register locations where configuration bits are stored and can be accessed. The translation between a first architecture and a new architecture is derived from differences between the first architecture and the new architecture. For example, translation can be based on a known or defined bit frame or bit address relationship, common structure or standard between the first architecture and the new architecture. The POF translator circuit 24 also operates to add configuration bits, if required by a new architecture. The configuration bits from the POF translator circuit 24 are downloaded to the appropriate addresses in the PLD core 22. The PLD core 22 includes programmable elements that are configured in accordance with the configuration bits received from the POF translator circuit 24. The PLD core 22 may include a plurality of logic array blocks (LABs) comprising an array of memory elements. Each LAB includes a plurality of logic elements each of which is capable of performing simple logic functions. An internal logic interconnect included within each LAB serves to interconnect each of the logic elements included therein.

Figure 2:
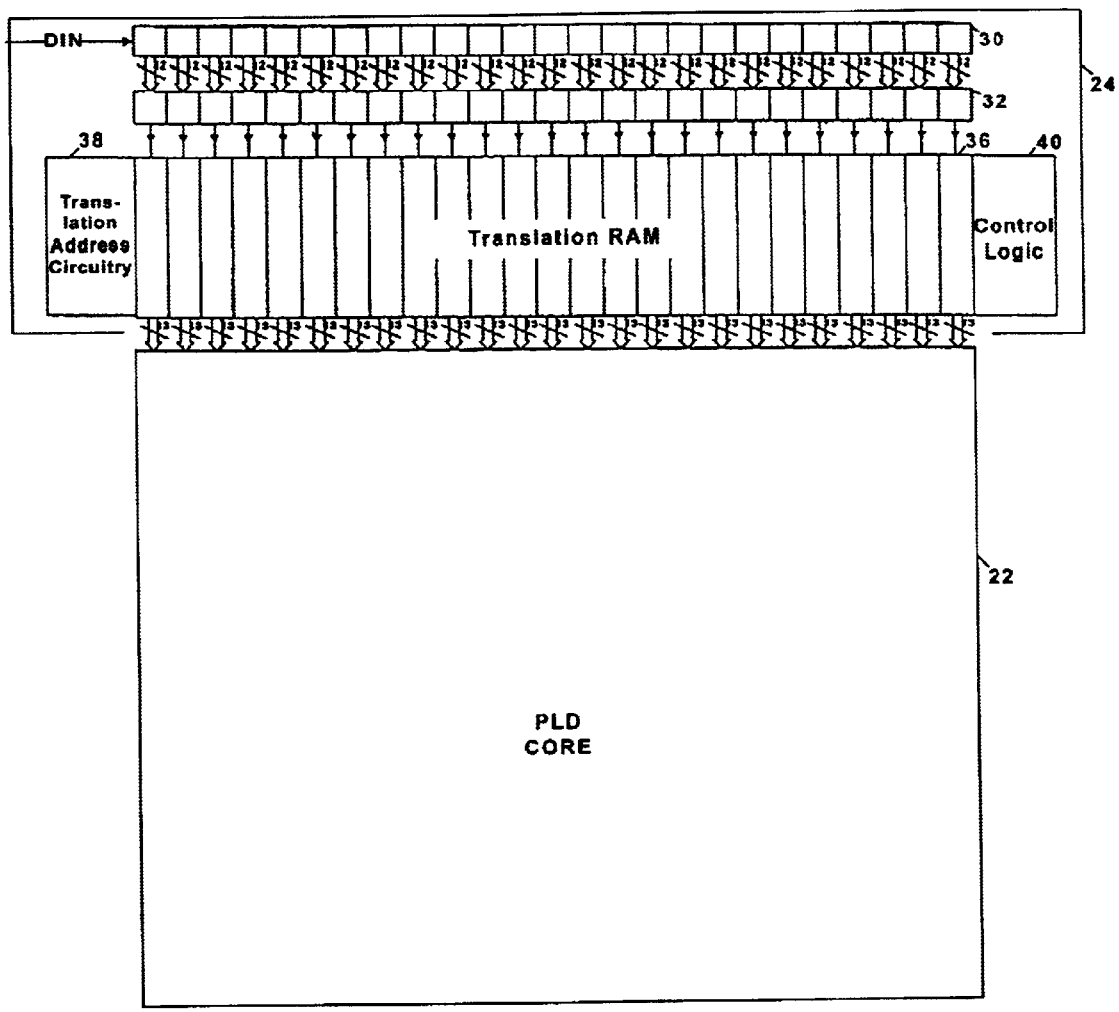
FIG. 2 is a more detailed representation of the programmable logic device of FIG. 1.

FIG. 2 is a more detailed illustration of the components of FIG. 1. FIG. 2 illustrates the PLD core 22 connected to the POF translator circuit 24. The POF translator circuit 24 includes a first register 30, which serially receives a stream of configuration data. Once the first register 30 is filled, it loads, in parallel, its contents to a second register 32. Individual bits or groups of bits are then processed from the second register 32. Each register 30 and 32 comprises bit frames that contain one or more configuration bits. The bit frames of either register may be identifiable by a bit frame number or frame address for purposes of facilitating the translation of a configuration file as described below. For the purpose of convenience, the invention is described in connection with the processing of individual bits.

The POF translator circuit 24 includes a translation memory 36. In this embodiment, the memory 36 is implemented as Random Access Memory (RAM). Translation memory 36 can also be implemented as other memories, such as PROMs (EPROM, EEPROM, Flash EPROM), DRAM, SRAM, SDRAM, etc. Associated with the translation memory 36 is translation address circuitry 38 and control logic 40. The translation address circuitry 38 operates with the translation memory 36 and control logic 40 to translate a configuration file used in connection with a first PLD architecture into a configuration file that can be used in connection with a new architecture. In one preferred embodiment, translation address circuitry 38 operates with the translation memory 36 and control logic 40 to translate addresses or bit frames for configuration bits associated with a first generation PLD into new addresses or bit frames for configuration bits associated with the new PLD architecture. The relationship between the old and new PLD architectures is derived from differences between the architectures. For example, translation can be based on a common structure, a known or defined bit frame or address relationship, or standard between a first architecture and new architecture. The translation address circuitry 38 also operates to add configuration bits, if required by a new architecture. The configuration bits from the POF translator circuit 24 are eventually downloaded to the appropriate addresses in the PLD core 22.

Figure 3:
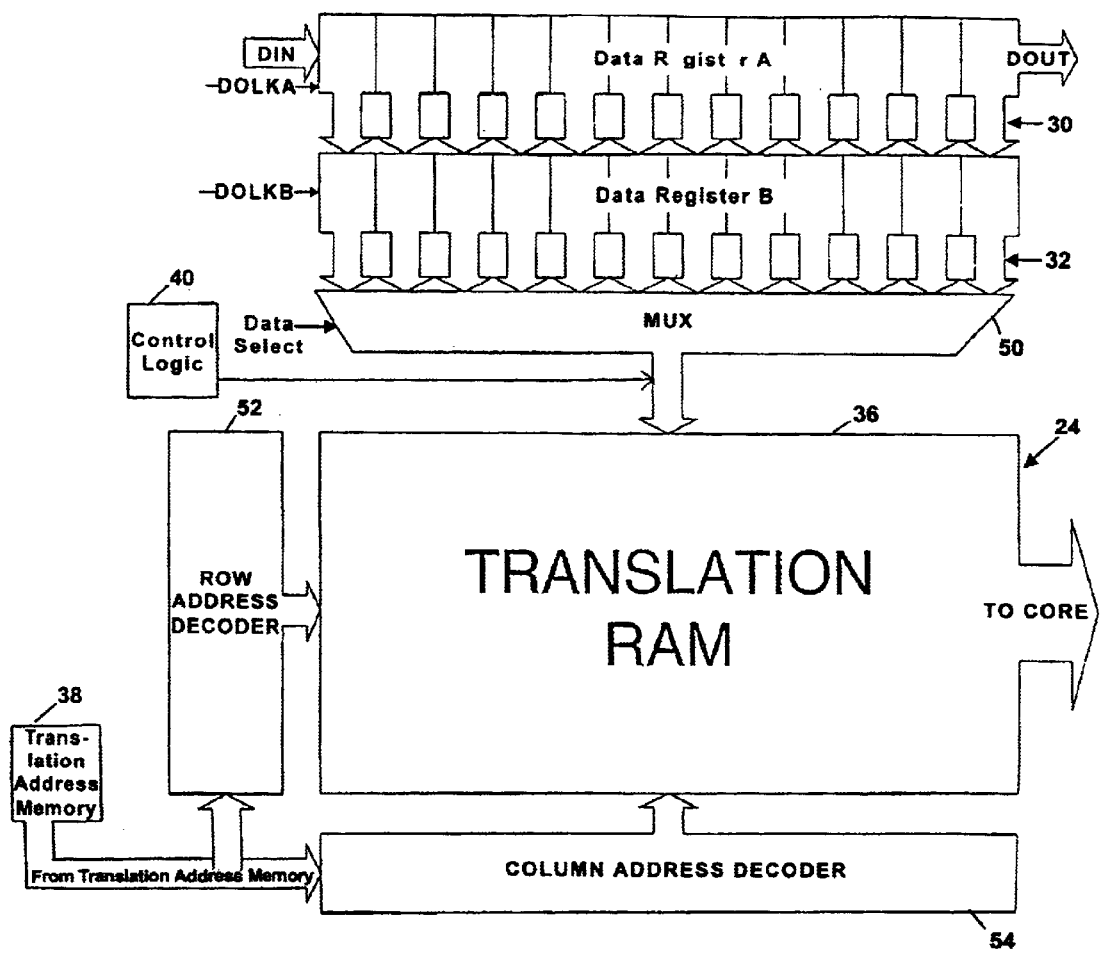
FIG. 3 is a more detailed representation of components associated with an embodiment of a Programmer Object File (POF) translator circuit of the invention.

FIG. 3 is a more detailed illustration of the POF translator circuit 24. The POF translator circuit includes one or more registers. FIG. 3 illustrates a first register 30, a second register 32, and the translation RAM 36. Register 30 receives a configuration file of a first architecture. Register 32 receives configuration data in parallel with register 30. The first register 30 and second register 32 may be configured to allow the processing of configuration bits from the second register 32 while the first register 30 receives configuration data of a first architecture. In this embodiment, a multiplexer 50 is used to read individual configuration bits from the second register 32. The multiplexer 50 is operated by control logic 40, which keeps track of the configuration bit being processed and provides an appropriate data select signal to the multiplexer 50. The multiplexer 50 may be implemented, for example, as a 12:1 multiplexer as shown. In addition, the control logic 40 operates to add additional configuration bits, when required by a new PLD architecture.

FIG. 3 further illustrates a translation address memory 38. Translation can be based on a variety of associations that utilize existing configuration data with new architectures. The relationship between a first architecture and a new architecture is derived from differences between the first architecture and the new architecture. For instance, translation can be based on a common structure, bit frame or address relationship, or standard between the first architecture and the new architecture. As an example, translation for an address, or bit frame, may be stored in the translation address memory 38 and used to translate the address, or bit frame, of each configuration bit of a first configuration file as each bit is accessed in a sequence from a register, such as second register 32. Translation address memory 38 may be configured to translate addresses, bit frames information or other configuration address information for configuration data of a first PLD architecture to corresponding addresses bit frames or other configuration address information for a new PLD architecture. In one embodiment, bit translation may occur in a particular sequence until all are done taken in a sequence until all are done.

Each new address from translation address memory 38 may be applied to a row address decoder 52 and a column address decoder 54 to store each configuration bit at its newly specified address or frame location. In one embodiment, access to the translation address memory 38 may be synchronized based on the bit number from a register associated with a first architecture. Alternatively, access to the translation address memory 38 may be synchronized based on a bit frame associated with a register of a first architecture. Bit numbers and/or bit frame information may be processed to indicate or identify how many register 30 to register. 32 transfers have taken place based on the relationship between the first architecture and the new architecture.

The translation RAM 36 can be implemented as an array for storing configuration bits as locations in response to row address decoder 52 and column address decoder 54. The translation RAM 36, when filled, or in response to clock signals or other control signals, loads its contents into PLD core RAM, where the transfer from the translation RAM 36 to PLD core RAM can be performed by a variety of methods. For example, the transfer from the translation RAM 36 can occur as a row-by-row, column-by-column or other transfer relationship from the translation RAM 36 to an appropriate location in the PLD core RAM. Preferably, the translation from the translation RAM 36 is allowed to transfer into the PLD core in the same way that devices without the translation circuit 24 are normally programmed. The translation may be repeated to allow reuse of the translation RAM 36 as necessary or until PLD core RAM has received an appropriate translated configuration file. The transfer from the translation RAM need not be necessarily done when the translation RAM 36 is full. The transfer from the translation RAM 36 to the PLD core RAM is preferably linked to a bit frame number of register 32 to maintain synchronization of the transfer.

Figure 4:
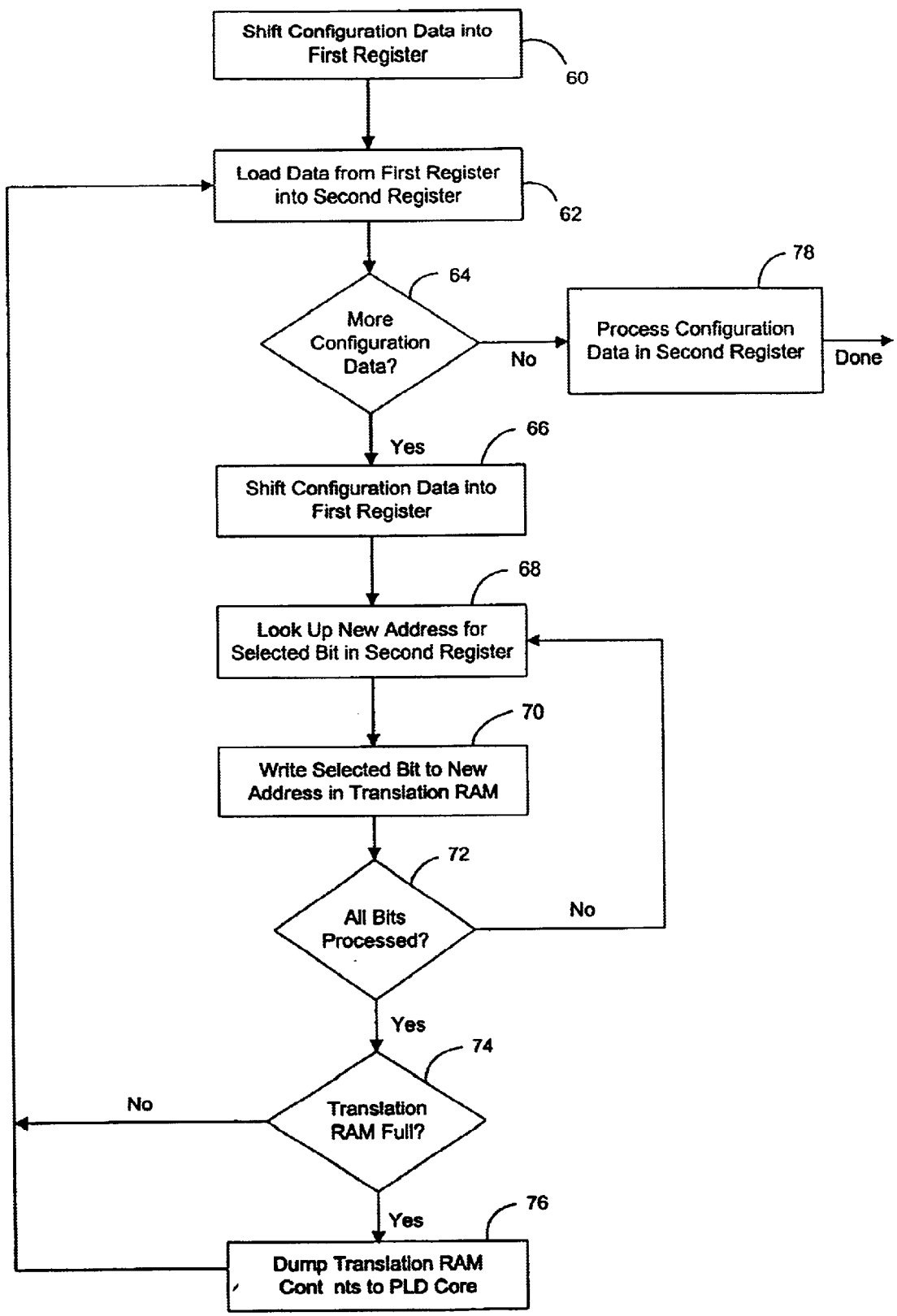
FIG. 4 illustrates processing steps performed in accordance with an embodiment of the invention.

FIG. 4 illustrates processing steps associated with an embodiment of the invention. The first processing step shown in FIG. 4 is to shift configuration data into a first register (step 60). After the first register is full, the contents of the register are transferred, in parallel, to the second register (step 62). It is then determined whether more configuration data exists (step 64). If so, additional configuration data is shifted into the first register (step 66). While this additional configuration data is shifted into the first register, steps 68–76 are performed.

A new address for a selected bit of the second register is looked up (step 68). In other words, the translation address memory 38 is used to map the address from the configuration file to a new address in the revised PLD architecture. The translation address memory 38 translates an original address for a selected configuration bit of the configuration data to the translated address. The selected bit is then written to the new address in the translation memory (step 70).

It is then determined whether all bits within the second register have been processed (step 72). If not, then processing returns to step 68. If so, it is determined whether the translation memory is full (step 74). If the translation memory is full, the contents of the translation memory are transferred to the PLD core (step 76). Thereafter, processing returns to step 62. If the translation memory is not full, processing immediately returns to step 62.

After configuration data is transferred from the first register to the second register (step 62), a determination is once again made whether there is more configuration data (step 64). If there is no more configuration data, then the configuration data in the second register is processed (step 78) and the processing is completed. The configuration data in the second register is processed by performing steps 68–72 until all of the configuration bits have been processed. Once all of the configuration bits have been processed, the configuration data within the translation memory is transferred to the PLD core to complete the processing.

Figure 5:
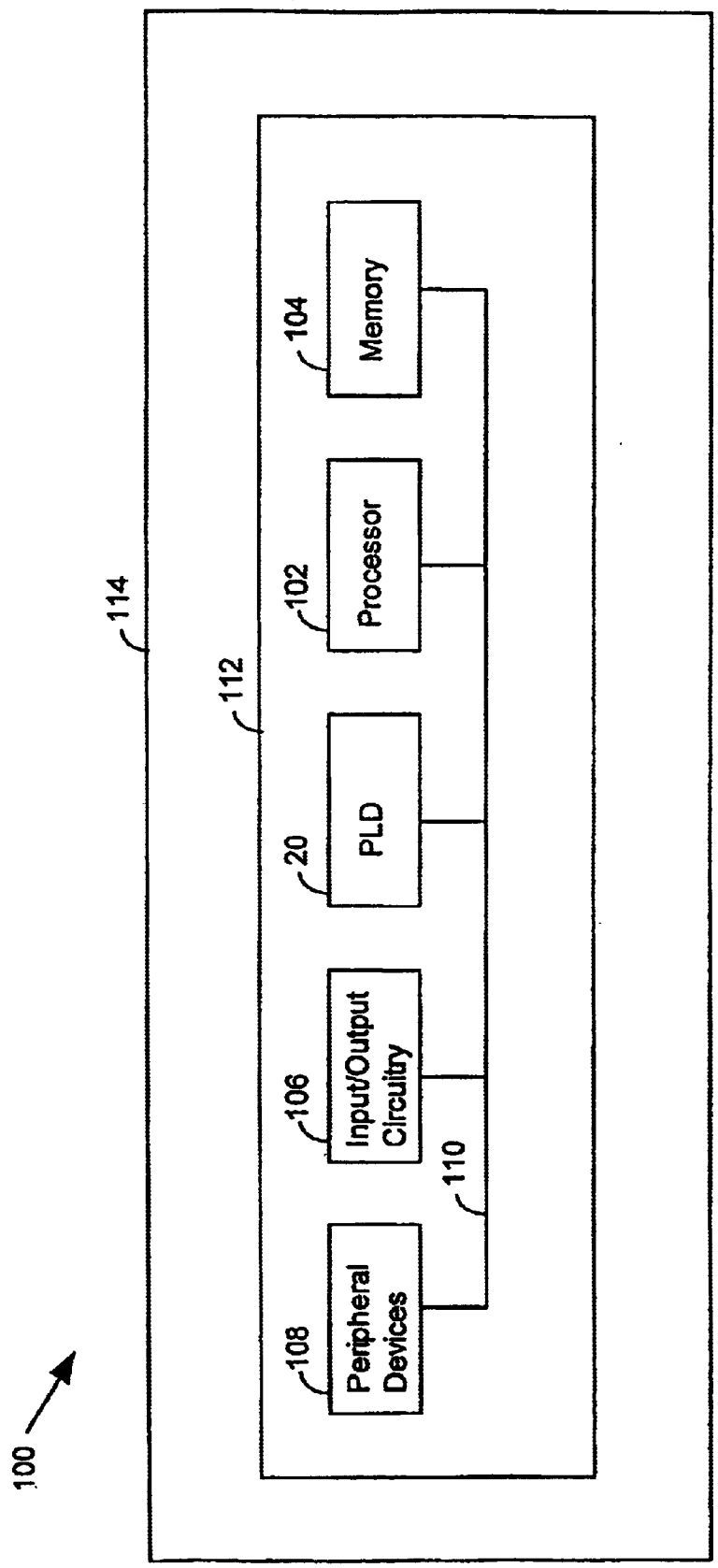
FIG. 5 illustrates the programmable logic device of the invention incorporated into a digital system.

As shown in FIG. 5, the PLD 20 of the invention may be incorporated into a large digital system. For example, the PLD 20 may form a part of a data processing system 100. The data processing system 100 may include one or more of the following components: a processor 102, a memory 104, input/output circuitry 106, and peripheral devices 108. These components are coupled together by a system bus 110 and are populated on a circuit board 112, which is contained in an end-user system 114.

The system 100 can be used in a wide variety of applications, such as computer networking, data networking, instrumentation, video processing, digital signal processing, or any other application where the advantage of using re-programmable logic is desirable. The PLD 20 may be configured to perform a variety of logic functions. For example, the PLD 20 can be configured as a processor or controller that works in cooperation with processor 102. Implementing the processor in the PLD offers the benefit of added design flexibility and the reduction of implementation costs. The PLD 20 may also be used as an arbiter for arbitrating access to a shared resource in the system 100. In yet another example, the PLD 20 can be configured as an interface between the processor 102 and one of the other components in the system 100.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of translating a configuration file for configuring a programmable logic device (PLD), said method comprising:
    shifting configuration data into a first register;
    loading, in parallel, said configuration data from said first register into a second register;
    shifting additional configuration data into said first register while performing the steps of:
        obtaining from a translation address memory a new address for a selected configuration bit in said second register,
        writing said selected configuration bit to said new address in a memory,
        repeating said obtaining and writing steps until all configuration bits in said second register have been processed; and
    downloading the contents of said memory to a programmable logic device core so as to configure said programmable logic device.

2. The method of claim 1 wherein said loading, in parallel, said configuration data from said first register into a second register comprises adding configuration bits to the second register.

3. A circuit for translating a configuration file used to configure a programmable logic device (PLD), comprising:
    a first register to serially receive configuration data;
    a second register to receive, in parallel, configuration data from said first register;
    a translation address memory providing a translated address for a selected configuration bit;
    a translation memory to store said selected configuration bit in response to said translated address memory; and
    control logic to download configuration data from said translation memory to a programmable logic device core associable with the PLD.

4. The circuit of claim 3 for translating a configuration file used to configure a PLD wherein the control logic tracks the configuration bit being processed.

5. The circuit of claim 3 for translating a configuration file used to configure a PLD wherein the control logic operates to add configuration bits to the downloaded configuration data.

6. The circuit of claim 3 for translating a configuration file used to configure a PLD wherein said translation address memory is operable to translate at least one configuration bit associated with a first PLD into an address associated with the PLD.

7. A circuit for translating a first configuration file associable with a first programmable logic device (PLD) into a second configuration file associable with a second PLD.

8. The circuit of claim 7 for translating a first configuration file wherein said circuit operates to translate at least one address for a configuration bit associated with the first PLD into at least one address for a configuration bit associated with the second PLD.

9. The circuit of claim 7 for translating a first configuration file wherein said circuit is capable of adding configuration bits for the configuration file associable with second PLD.

10. The circuit of claim 7 for translating a first configuration file wherein said circuit includes translation memory.

11. The circuit of claim 7 for translating a first configuration file wherein said translation memory is implemented as random access memory (RAM).

12. The circuit of claim 7 for translating a first configuration file further including translation address circuitry.

13. The circuit of claim 7 for translating a first configuration file further including control logic.

14. The circuit of claim 13 for translating a first configuration file wherein the control logic operates to add at least one configuration bit into the configuration file associable with a second PLD.

15. A processing system comprising:
    a programmable logic device (PLD); and
    a circuit for translating a first configuration file used to configure the PLD;
        a register to receive configuration data of the first configuration file;
        a translation address memory to translate an original address for a selected configuration bit of said configuration data to a translated address associable with the PLD;
        a translation memory to store said selected configuration bit at said translated address; and
        control logic to selectively download configuration data from said translation memory to a programmable logic device core associable with the PLD.

16. The processing system of claim 15 wherein the PLD contains processor circuitry.

17. The processing system of claim 15 wherein the PLD is a circuit for processing input signals.

18. The processing system of claim 15 wherein the PLD is a circuit for processing output signals.

19. The processing system of claim 15 wherein the PLD is a circuit for processing video signals.

* * * * *